(12) United States Patent
Hwang

(10) Patent No.: US 9,859,932 B2
(45) Date of Patent: Jan. 2, 2018

(54) RECEIVER CIRCUIT AND SYSTEM USING THE SAME

(71) Applicant: SK hynix Inc., Icheon-si, Gyeonggi-do (KR)

(72) Inventor: Kyu Dong Hwang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/145,510

(22) Filed: May 3, 2016

(65) Prior Publication Data
US 2017/0230018 A1    Aug. 10, 2017

(30) Foreign Application Priority Data

Feb. 5, 2016  (KR) .................. 10-2016-0014701

(51) Int. Cl.
*H03F 3/45* (2006.01)
*H04B 1/16* (2006.01)
*H03F 1/02* (2006.01)
*H03F 1/32* (2006.01)

(52) U.S. Cl.
CPC ............ *H04B 1/16* (2013.01); *H03F 1/0211* (2013.01); *H03F 3/45475* (2013.01); *H03F 1/3211* (2013.01); *H03F 3/45* (2013.01); *H03F 3/45076* (2013.01); *H03F 2200/351* (2013.01); *H03F 2200/411* (2013.01); *H03F 2200/516* (2013.01); *H03F 2203/45138* (2013.01); *H03F 2203/45652* (2013.01)

(58) Field of Classification Search
CPC ...... H03F 3/45071; H03F 1/3211; H03F 3/45; H03F 3/45076; H03F 3/4508; H03F 3/45179; H03F 3/45183; H03F 3/45188; H03F 3/19; H03F 2200/451; H03F 2200/54; H03F 1/0261; H04B 1/16; H03B 5/1221
USPC .................. 330/98, 133, 150, 252, 253, 310
See application file for complete search history.

(56) References Cited

U.S. PATENT DOCUMENTS

| | | | | |
|---|---|---|---|---|
| 6,411,145 B1 * | 6/2002 | Kueng | ................. | H03K 5/1565 330/267 |
| 7,012,467 B2 * | 3/2006 | Morgan | .............. | H03F 3/45484 330/261 |
| 7,816,987 B2 * | 10/2010 | Takaso | ................ | H03F 3/45085 330/252 |
| 8,102,203 B2 * | 1/2012 | Drost | ........................ | H03F 1/30 330/9 |
| 8,125,268 B2 | 2/2012 | Pan et al. | | |
| 9,362,867 B2 * | 6/2016 | Yang | ........................ | H03F 1/30 |

FOREIGN PATENT DOCUMENTS

KR       101196449 B1    11/2012

* cited by examiner

*Primary Examiner* — Khanh V Nguyen
(74) *Attorney, Agent, or Firm* — William Park & Associates Ltd.

(57) ABSTRACT

A receiver circuit may be provided. The receiver circuit may include a first duty cycle adjuster configured to correct a duty cycle of a first output signal pair. The receiver circuit may include a second duty cycle adjuster configured to correct a duty cycle of a second output signal pair, based on the first output signal pair, after the first duty cycle adjuster performs a correction on the duty cycle of the first output signal pair.

19 Claims, 5 Drawing Sheets

RECEIVER CIRCUIT AND SYSTEM USING THE SAME

CROSS-REFERENCES TO RELATED APPLICATION

The present application claims priority under 35 U.S.C. §119(a) to Korean application number 10-2016-0014701, filed on Feb. 5, 2016, in the Korean Intellectual Property Office, which is incorporated herein by reference in its entirety.

BACKGROUND

1. Technical Field

Various embodiments generally relate to a semiconductor apparatus, and, more particularly, to a receiver circuit capable of receiving a transmitted signal, and a system using the receiver circuit.

2. Related Art

Electronic products for personal use, such as a personal computer, a tablet PC, a laptop computer and a smart phone, may be constructed by various electronic components. Two different electronic components in the electronic products may communicate with each other at a high speed to process a large amount of data within a short amount of time. Among the electronic components, semiconductor apparatuses may consist of a transceiver circuit and a receiver circuit and exchange signals with each other.

The semiconductor apparatuses may be coupled with each other by a signal transmission line such as a bus and exchange signals with each other. As the performance of semiconductor apparatuses are improved, developments for a semiconductor apparatus capable of operating at a high speed while reducing power consumption are in need. Accordingly, the level or amplitude of a signal to be transmitted through the bus is gradually decreasing. Therefore, an improved receiver structure capable of precisely receiving a signal transmitted through a signal transmission line is needed.

SUMMARY

In an embodiment, a receiver circuit may be provided. The receiver circuit may include a first amplification circuit configured to differentially amplify first and second input signals and generate a first output signal pair. The receiver circuit may include a first duty cycle adjuster configured to correct a duty cycle of the first output signal pair based on a duty correction code. The receiver circuit may include a second amplification circuit configured to differentially amplify the first output signal pair and generate a second output signal pair. The receiver circuit may include a second duty cycle adjuster configured to correct a duty cycle of the second output signal pair based on the duty correction code.

In an embodiment, a receiver circuit may be provided. The receiver circuit may include a first stage buffer configured to differentially amplify first and second input signals. The receiver circuit may include a second stage buffer configured to amplify an output signal pair of the first stage buffer. The receiver circuit may include a third stage buffer configured to amplify an output signal pair of the second stage buffer. The receiver circuit may include a first duty cycle adjuster configured to generate a first duty correction current. The receiver circuit may include a second duty cycle adjuster configured to generate a second duty correction current. The first duty cycle adjuster may provide the first duty correction current to a buffer disposed at a stage preceding a buffer to which the second duty cycle adjuster provides the second duty correction current.

In an embodiment, a receiver circuit may be provided. The receiver circuit may include a first duty cycle adjuster configured to correct a duty cycle of a first output signal pair. The receiver circuit may include an amplification circuit configured to differentially amplify the first output signal pair and generate a second output signal pair. The receiver circuit may include a second duty cycle adjuster configured to correct a duty cycle of the second output signal pair.

DETAILED DESCRIPTION

Figure 1:
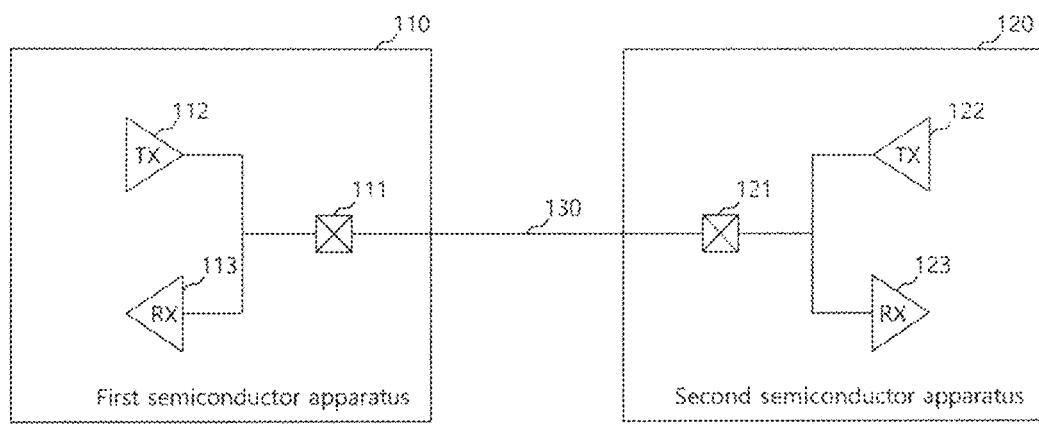
FIG. 1 is a diagram illustrating a representation of an example of a configuration of a system in accordance with an embodiment.

As illustrated in FIG. 1, a system 1 in accordance with an embodiment may include a first semiconductor apparatus 110 and a second semiconductor apparatus 120. The first semiconductor apparatus 110 and the second semiconductor apparatus 120 may be electronic components that communicate with each other. In an embodiment, the first semiconductor apparatus 110 may be a master apparatus, and the second semiconductor apparatus 120 may be a slave apparatus that is operated under control of the first semiconductor apparatus 110. For example, the first semiconductor apparatus 110 may be a host apparatus such as a processor, and the processor may include a central processing unit (CPU), a graphic processing unit (GPU), a multi-media processor (MMP), and a digital signal processor. The first semiconductor apparatus 110 may be embodied in the form of a System on Chip (SoC) by combining processor chips such as application processors AP having various functions. The second semiconductor apparatus 120 may be a memory, and the memory may include a volatile memory and a nonvolatile memory. The volatile memory may include a static RAM (SRAM), a dynamic RAM (DRAM), and a synchronous DRAM (SDRAM). The nonvolatile memory may include a read only memory (ROM), a programmable ROM (PROM), an electrically erasable and programmable ROM (EEPROM), an electrically programmable ROM (EPROM), a phase change RAM (PCRAM), a magnetic RAM (MRAM), a resistive RAM (RRAM), a ferroelectric RAM (FRAM), and so forth.

The first and second semiconductor apparatuses 110 and 120 may be coupled with each other through a signal transmission line 130. The first semiconductor apparatus 110 includes a pad 111, and the pad 111 may be coupled with the signal transmission line 130. The second semiconductor apparatus 120 includes a pad 121, and the pad 121 may be coupled with the signal transmission line 130. The signal transmission line 130 may be a channel, a link or a bus. The first semiconductor apparatus 110 may include a transceiver circuit (TX) 112 and a receiver circuit (RX) 113. The transceiver circuit 112 may generate an output signal according to an internal signal of the first semiconductor apparatus 110, and transmit the output signal to the second semiconductor apparatus 120 through the signal transmission line 130. The receiver circuit 113 may receive, through the signal transmission line 130, a signal transmitted from the second semiconductor apparatus 120 and generate an internal signal. The second semiconductor apparatus 120 may include a transceiver circuit (TX) 122 and a receiver circuit (RX) 123. The transceiver circuit 122 may generate an output signal according to an internal signal of the second semiconductor apparatus 120, and transmit the output signal to the first semiconductor apparatus 110 through the signal transmission line 130. The receiver circuit 123 may receive, through the signal transmission line 130, a signal transmitted from the first semiconductor apparatus 110 and generate an internal signal.

Figure 2:
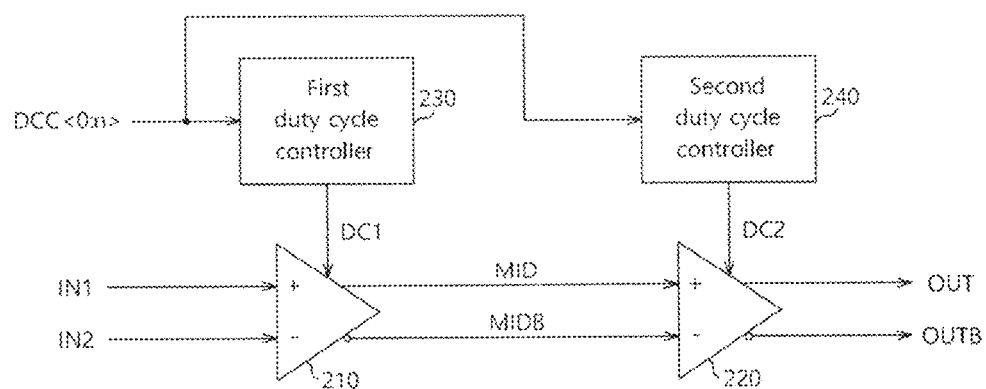
FIG. 2 is a diagram illustrating a representation of an example of a configuration of a receiver circuit in accordance with an embodiment.

FIG. 2 is a diagram illustrating the configuration of a receiver circuit 200 in accordance with an embodiment. The receiver circuit 200 of FIG. 2 may be used as the receiver circuit 113 or 123 illustrated in FIG. 1. The receiver circuit 200 may include a first amplification circuit 210, a second amplification circuit 220, a first duty cycle adjuster 230, and a second duty cycle adjuster 240. The first amplification circuit 210 may receive a first input signal IN1 and a second input signal IN2. The first amplification circuit 210 may differentially amplify the first input signal IN1 and the second input signal IN2 and generate a first output signal pair MID and MIDB. The first output signal pair may include a first middle output signal MID and a second middle output signal MIDB. The second middle output signal MIDB may be a differential signal of the first middle output signal MID. In an embodiment, the second input signal IN2 may be a differential signal of the first input signal IN1. In an embodiment, the second input signal IN2 may be a reference voltage having a level set depending on a swing width of the first input signal IN1. The reference voltage may have a level corresponding to the middle of the swing width of the first input signal IN1. For example, if the first input signal has an amplitude ranging from 0 V to 0.5 V, the reference voltage may have a voltage level corresponding to 0.25 V.

The second amplification circuit 220 may receive the first output signal pair MID and MIDB. The second amplification circuit 220 may differentially amplify the first output signal pair MID and MID and generate a second output signal pair OUT and OUTB. The second output signal pair may include a first final output signal OUT and a second final output signal OUTB.

The first duty cycle adjuster 230 may correct a duty cycle of the first output signal pair MID and MIDB based on a duty correction code DCC<0:n>. The first duty cycle adjuster 230 may generate a first duty correction current DC1 based on the duty correction code DCC<0:n> and provide the first duty correction current DC1 to the first amplification circuit 210. The second duty cycle adjuster 240 may correct a duty cycle of the second output signal pair OUT and OUTB based on the duty correction code DCC<0:n>. The second duty cycle adjuster 240 may generate a second duty correction current DC2 based on the duty correction code DCC<0:n> and provide the second duty correction current DC2 to the second amplification circuit 220. The duty correction code DCC<0:n> may be generated from a feedback loop duty detection circuit, or may be generated from an open loop duty detection circuit. In an embodiment, the duty correction code DCC<0:n> may be provided from an external apparatus that is coupled with a semiconductor apparatus including the receiver circuit 200.

The first duty cycle adjuster 230 may have a first duty correction strength, and the second duty cycle adjuster 240 may have a second duty correction strength. The first duty correction strength may differ from the second duty correction strength. The duty correction strength may be defined as a range capable of correcting the duty cycle. For example, the first and second duty cycle adjusters 230 and 240 may include the same semiconductor devices and the same circuit configuration. In this regard, to set the first duty correction strength to be greater than the second duty correction strength, the sizes of semiconductor devices constituting the first duty cycle adjuster 230 may be designed to be greater than the sizes of semiconductor devices constituting the second duty cycle adjuster 240. For example, if it is assumed that the second duty cycle adjuster 240 is able to correct a duty cycle of a range of 5%, the first duty cycle adjuster 230 may correct a duty cycle of a range of 10%.

The duty correction strength, along with the amplitude of a signal inputted to the amplification circuit, may affect a duty correction rate per unit time of the duty cycle adjuster. The duty correction rate per unit time may be a duty correction resolution and/or range. For example, as the duty correction strength of the duty cycle correction circuit is increased and the amplitude of a signal received to the amplification circuit is reduced, the duty correction rate per unit time may be increased. For example, as the duty correction strength of the duty cycle adjuster is reduced and the amplitude of the signal received to the amplification circuit is increased, the duty correction rate per unit time may be reduced.

Because the first amplification circuit 210 amplifies the first input signal IN1 and the second input signal IN2 and generates the first output signal pair MID and MIDB, the first input signal IN1 and the second input signal IN2 may have amplitudes less than that of the first output signal pair MID and MIDB. Therefore, a duty correction rate per unit time for the first output signal pair MID and MIDB by the first duty cycle adjuster 230 may be greater than a duty correction rate per unit time for the second output signal pair OUT and OUTB by the second duty cycle adjuster 240. In the case where the duty correction strengths of the first and second duty cycle adjusters 230 and 240 are set to be different, the duty correction rates per unit time of the first and second duty cycle adjusters 230 and 240 may vary. That is, in the present embodiment, the duty correction rates per unit time by the first and second duty cycle adjusters 230 and 240 may vary based on the first and second duty correction strengths and amplitudes of signals received to the amplification circuits to which the first and second duty cycle adjusters 230 and 240 are coupled.

If a duty cycle adjuster is coupled to only the first amplification circuit 210, the duty correction rate per unit time by the duty cycle adjuster is excessively increased, so that the duty variation rate of the first output signal pair MID and MIDB depending on variation in amplitude of the first and second input signals IN1 and IN2 may be excessively increased. Therefore, it is difficult to generate a precise output signal from the receiver circuit. On the contrary, if the duty cycle adjuster is coupled to only the second amplification circuit 220, the duty correction rate per unit time of the duty cycle adjuster is excessively reduced, so that the duty variation rate of the second output signal pair OUT and OUTB may be excessively reduced. Therefore, since the range capable of correcting the duty cycle is reduced, it is difficult to generate a precise output signal. The receiver circuit 200 in accordance with an embodiment includes not only the first duty cycle adjuster 230 coupled with the first amplification circuit 210 that receives the first and second input signals IN1 and IN2 having small amplitudes but also the second duty cycle adjuster 240 coupled with the second amplification circuit 220 that receives the first output signal pair MID and MIDB having a relatively large amplitude, and thus is able to solve the problem caused when the duty cycle adjuster is coupled to only any one side.

Figure 3:
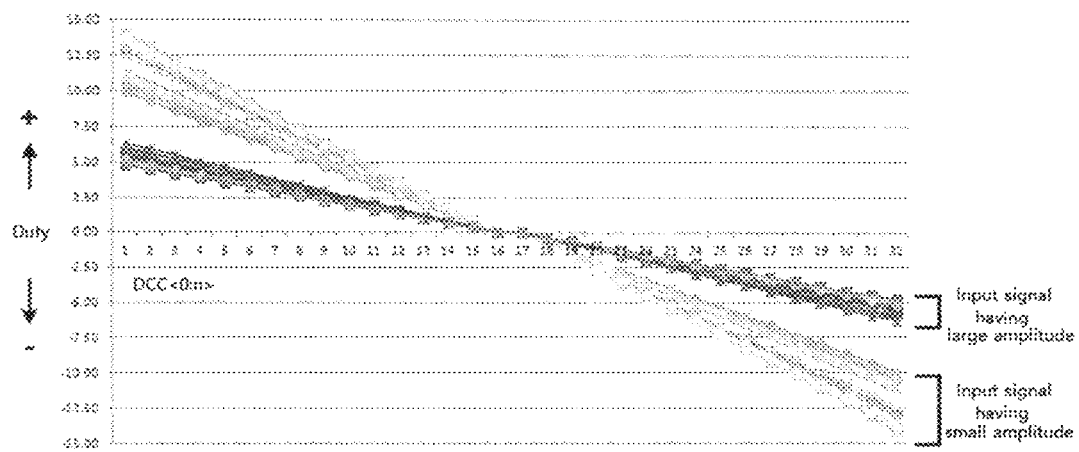
FIG. 3 is a graph illustrating a variation rate of a duty cycle of an output signal and a duty correction rate per unit time according to the amplitude of an input signal inputted to an amplification circuit.

FIG. 3 is a graph illustrating a variation rate of a duty cycle of an output signal and a duty correction rate per unit time according to an amplitude of an input signal inputted to an amplification circuit. Referring to FIG. 3, the x axis indicates the value of the duty correction code DCC<0:n>, and the y axis indicates the variation rate of the duty cycle. As illustrated in FIG. 3, it may be seen that as the amplitude of an input signal inputted to the amplification circuit is reduced, the variation rate of the duty cycle of the output signal depending on variation in the value of the duty correction code DCC<0:n> is increased, and as the amplitude of the input signal is increased, the variation rate of the duty cycle of the output signal depending on variation in the value of the duty correction code DCC<0:n> is reduced.

Figure 4:
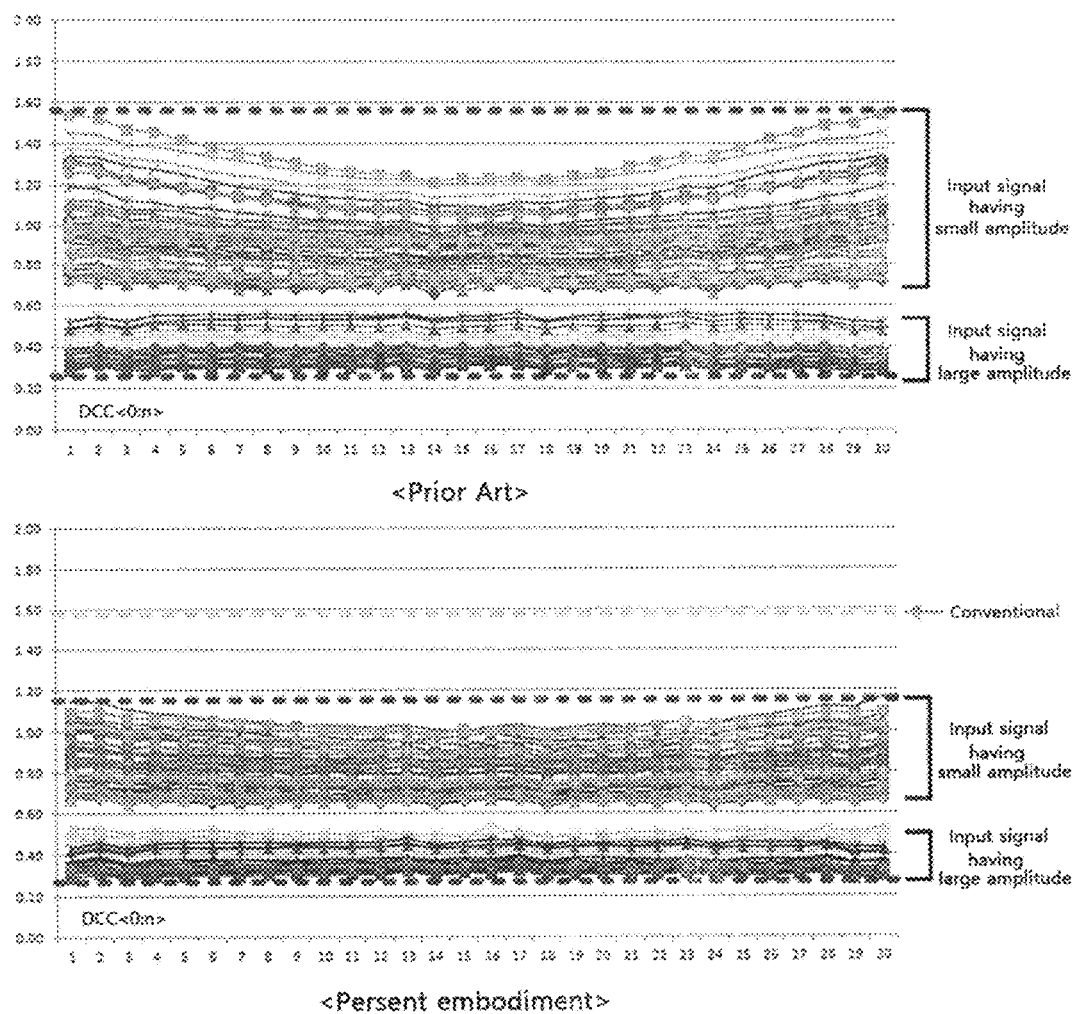
FIG. 4 is a graph comparing duty correction resolution between a conventional art using a single duty cycle adjuster and an embodiment using two duty cycle adjusters.

FIG. 4 is a graph comparing duty correction resolution between the conventional art or prior art using a single duty cycle adjuster and a present embodiment using two duty cycle adjusters. Referring to FIG. 4, the x axis indicates the value of the duty correction code DCC<0:n>, and the y axis indicates the duty correction rate per unit time. As illustrated in FIG. 4, it may be seen that, in the case of the conventional art using the single duty cycle adjuster, the deviation of the duty correction rate per unit time depending on variation in amplitude of an input signal inputted to the amplification circuit is large. That is, when the amplitude of the input signal is small, the duty correction rate per unit time may be excessively increased, and when the amplitude of the input signal is large, the duty correction rate per unit time may be excessively reduced. Therefore, a duty variation width of the output signal may be very large, and it is difficult to generate a precise output signal. The receiver circuit 200 in accordance with a present embodiment includes the first duty cycle adjuster 230 that is coupled with the first amplification circuit 210 which receives a signal having a small amplitude, and the second duty cycle adjuster 240 that is coupled with the second amplification circuit 220 which receives a signal having a relatively large amplitude, and thus is able to markedly reduce the duty variation width of the output signal compared to that of the conventional art. A large duty correction rate per unit time by the first duty cycle adjuster 210 is offset by a small duty correction rate per unit time by the second duty cycle adjuster 220, whereby a duty variation width of final output signals OUT and OUTB may be reduced. Furthermore, the duty variation width of the final output signals OUT and OUTB may be further reduced by relatively adjusting the first and second duty correction strengths.

Figure 5:
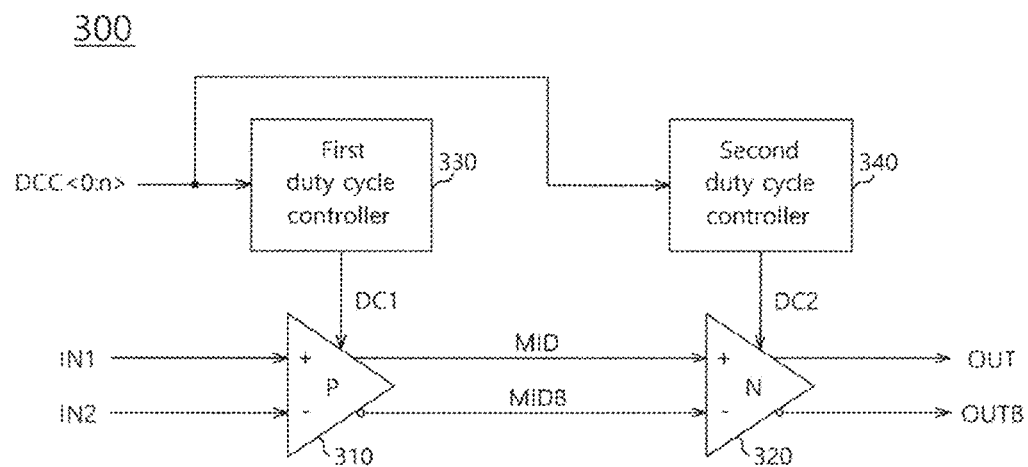
FIG. 5 is a diagram illustrating a representation of an example of a configuration of a receiver circuit in accordance with an embodiment.

FIG. 5 is a diagram illustrating the configuration of a receiver circuit 300 in accordance with an embodiment. The receiver circuit 300 of FIG. 5 may be used as the receiver circuit 113 or 123 illustrated in FIG. 1. The receiver circuit 300 may include a first amplification circuit 310, a second amplification circuit 320, a first duty cycle adjuster 330 and a second duty cycle adjuster 340. The first amplification circuit 310 may differentially amplify a first input signal IN1 and a second input signal IN2 and generate a first output signal pair MID and MIDB. The second amplification circuit 320 may differentially amplify the first output signal pair MID and MID and generate a second output signal pair OUT and OUTB. The first duty cycle adjuster 330 may generate a first duty correction current DC1 based on the duty correction code DCC<0:n> and provide the first duty correction current DC1 to the first amplification circuit 310. The second duty cycle adjuster 340 may generate a second duty correction current DC2 based on the duty correction code DCC<0:n> and provide the second duty correction current DC2 to the second amplification circuit 340. The first duty cycle adjuster 330 may have a first duty correction strength. The second duty cycle adjuster 340 may have a second duty correction strength. The second duty correction strength may differ from the first duty correction strength.

Referring to FIG. 5, the first amplification circuit 310 may be a P-type differential amplifier, and the second amplification circuit 320 may be an N-type differential amplifier. In the case where the first and second amplification circuits 310 and 320 are constructed by the same type differential amplifier, the receiver circuit may be sensitive to process, voltage and temperature (PVT) variations, so that it is difficult to generate a precise output signal. In a present embodiment, two amplification circuits are constructed by opposite types of differential amplifiers so that a receiver circuit that is insensitive to PVT variations may be embodied. Although, in FIG. 5, there has been illustrated the case where the first amplification circuit 310 is a P-type differential amplifier and the second amplification circuit 320 is an N-type differential amplifier, it is not limited to this. The first amplification circuit 310 may be an N-type differential amplifier, and the second amplification circuit 320 may be a P-type differential amplifier. As the first and second amplification circuits 310 and 320 of the receiver circuit 300 are constructed by opposite types of differential amplifiers, effects resulting from PVT variations generated at any one side may be offset by effects resulting from PVT variations generated at the other side. Consequently, a second output signal pair OUT and OUTB having a more constant duty cycle may be generated.

Figure 6:
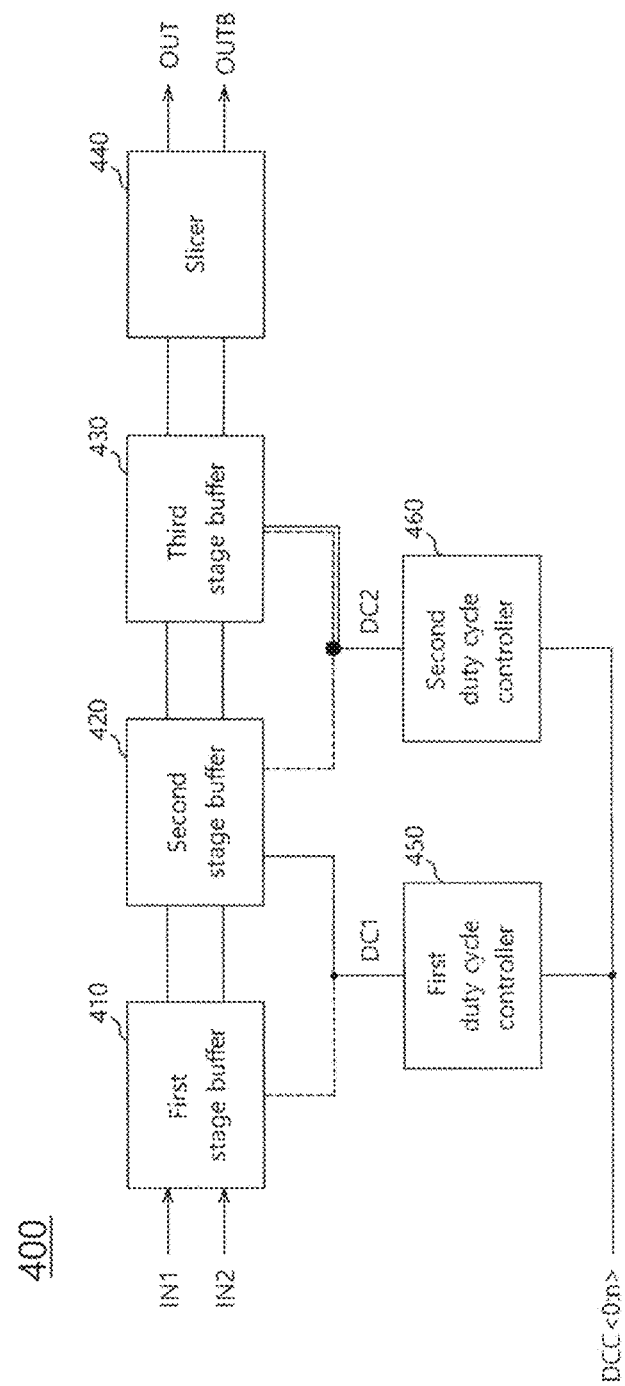
FIG. 6 is a diagram illustrating a representation of an example of a configuration of a receiver circuit in accordance with an embodiment.

FIG. 6 is a diagram illustrating the configuration of a receiver circuit 400 in accordance with an embodiment. The receiver circuit 400 may include a plurality of buffers and a plurality of duty cycle adjusters. Referring to FIG. 6, the receiver circuit 400 may include a first stage buffer 410, a second stage buffer 420, a third stage buffer 430, a slicer 440, a first duty cycle adjuster 450 and a second duty cycle adjuster 460. The first stage buffer 410 may receive first and second input signals IN1 and IN2 and differentially amplify the first and second input signals IN1 and IN2. The second stage buffer 420 may receive an output signal pair of the first stage buffer 410 and differentially amplify the output signal pair of the first stage buffer 410. The third stage buffer 430 may receive an output signal pair of the second stage buffer 420 and differentially amplify the output signal pair of the second stage buffer 420. The slicer 440 may buffer an output signal pair of the third stage buffer 430 and output a final output signal pair OUT and OUTB. Each of the first to third stage buffers 410, 420 and 430 may be a P-type differential amplifier or an N-type differential amplifier. One or more of the first to third stage buffers 410, 420 and 430 may be P-type and N-type combined differential amplifiers. For example, one or more of the first and second stage buffers 410 and 420 may be P-type differential amplifiers, and one or more of the second and third stage buffers 420 and 430 may be N-type differential amplifiers.

The first duty cycle adjuster 450 may generate a first duty correction current DC1 based on a duty correction code DCC<0:n>. The second duty cycle adjuster 460 may generate a second duty correction current DC2 based on the duty correction code DCC<0:n>. In a present embodiment, it may be preferable that the first duty cycle adjuster 450 be coupled with a buffer disposed at a stage preceding the second duty cycle adjuster 460. In the present embodiment, as illustrated by the dotted line, the first duty cycle adjuster 450 may provide a first duty correction current DC1 to the first stage buffer 410, and the second duty cycle adjuster 460 may provide a second duty correction current DC2 to either the second or third stage buffer 420 or 430. In the present embodiment, as illustrated by the solid line, the first duty cycle adjuster 450 may provide the first duty correction current DC1 to the second stage buffer 420, and the second duty cycle adjuster 460 may provide the second duty correction current DC2 to the third stage buffer 430.

The first duty cycle adjuster 450 may provide the first duty correction current DC1 to a buffer that receives a signal having a relatively small amplitude, and the second duty cycle adjuster 460 may provide the second duty correction current DC2 to a buffer that receives a signal having a relatively large amplitude. Therefore, the receiver circuit 400 may generate an output signal having a constant duty cycle regardless of variation in the amplitude of an input signal. The first duty cycle adjuster 450 may have a first duty correction strength, and the second duty cycle adjuster 460 may have a second duty correction strength. As the first and second duty correction strengths are adjusted, the receiver circuit 400 may generate an output signal having a more precise duty cycle.

While certain embodiments have been described above, it will be understood to those skilled in the art that the embodiments described are by way of example only. Accordingly, the receiver circuit described herein should not be limited based on the described embodiments. Rather, the receiver circuit described herein should only be limited in light of the claims that follow when taken in conjunction with the above description and accompanying drawings.

What is claimed is:

1. A receiver circuit comprising:
   a first amplification circuit configured to differentially amplify first and second input signals and generate a first output signal pair;
   a first duty cycle adjuster configured to correct a duty cycle of the first output signal pair based on a duty correction code;
   at least one amplification circuit configured to differentially amplify the first output signal pair;
   a second amplification circuit configured to differentially amplify the output of the at least one amplification circuit and generate a second output signal pair; and
   a second duty cycle adjuster configured to correct a duty cycle of the second output signal pair based on the duty correction code,
   wherein the second amplification circuit is complementary type differential amplifier with the first amplification circuit.

2. The receiver circuit according to claim 1, wherein an amplitude of the first and second input signals are less than an amplitude of the first output signal pair.

3. The receiver circuit according to claim 1, wherein a duty correction rate per unit time by the first duty cycle adjuster is greater than a duty correction rate per unit time by the second duty cycle adjuster.

4. The receiver circuit according to claim 1, wherein the first duty cycle adjuster has a first duty correction strength, and the second duty cycle adjuster has a second duty correction strength different from the first duty correction strength.

5. The receiver circuit according to claim 1, wherein the first duty cycle adjuster provides a first duty correction current generated based on the duty correction code, to the first amplification circuit.

6. The receiver circuit according to claim 5, wherein the second duty cycle adjuster provides a second duty correction current generated based on the duty correction code, to the second amplification circuit.

7. The receiver circuit according to claim 1, wherein the first amplification circuit is a P-type differential amplifier.

8. The receiver circuit according to claim 7, wherein the second amplification circuit is an N-type differential amplifier.

9. The receiver circuit according to claim 1, wherein the second input signal is a differential signal of the first input signal.

10. The receiver circuit according to claim 1, wherein the second input signal is a reference voltage which has a voltage level corresponding to a middle of a swing width of the first input signal.

11. A receiver circuit comprising:
    a first stage buffer configured to differentially amplify first and second input signals;
    a second stage buffer configured to amplify an output signal pair of the first stage buffer;
    a third stage buffer configured to amplify an output signal pair of the second stage buffer;
    a first duty cycle adjuster configured to generate a first duty correction current to the first stage buffer; and
    a second duty cycle adjuster configured to generate a second duty correction current to the third stage buffer,
    wherein the third stage buffer is complementary type differential amplifier with the first stage buffer.

12. The receiver circuit according to claim 11, wherein one or more of the first and second stage buffers are P-type differential amplifiers.

13. The receiver circuit according to claim 11, wherein one or more of the second and third stage buffers are N-type differential amplifiers.

14. The receiver circuit of claim 11, further comprising:
    a slicer configured to buffer an output signal pair of the third stage buffer and generate a final output signal pair.

15. The receiver circuit according to claim 11, wherein the second input signal is a differential signal of the first input signal.

16. The receiver circuit according to claim 11, wherein the second input signal is a reference voltage which has a voltage level corresponding to a middle of a swing width of the first input signal.

17. The receiver circuit according to claim 11, wherein a duty correction rate per unit time by the first duty cycle adjuster is greater than a duty correction rate per unit time by the second duty cycle adjuster.

18. The receiver circuit according to claim 11, wherein the first duty cycle adjuster has a first duty correction strength, and the second duty cycle adjuster has a second duty correction strength different from the first duty correction strength.

19. The receiver circuit according to claim 11, wherein the first and second duty cycle adjusters are configured to generate the first and second duty correction currents, respectively, based on a duty correction code.

\* \* \* \* \*